(12) United States Patent
Yu et al.

(10) Patent No.: US 10,355,021 B2
(45) Date of Patent: Jul. 16, 2019

(54) THIN FILM TRANSISTOR STRUCTURE AND METHOD FOR MANUFACTURING SAME

(71) Applicant: Shenzhen China Star Optoelectronics Semiconductor Display Technology Co., Ltd., Shenzhen (CN)

(72) Inventors: Mingjue Yu, Shenzhen (CN); Jangsoon Im, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/578,256

(22) PCT Filed: Nov. 8, 2017

(86) PCT No.: PCT/CN2017/109826
§ 371 (c)(1),
(2) Date: Nov. 30, 2017

(87) PCT Pub. No.: WO2019/056517
PCT Pub. Date: Mar. 28, 2019

(65) Prior Publication Data
US 2019/0088684 A1    Mar. 21, 2019

(30) Foreign Application Priority Data
Sep. 21, 2017 (CN) .......................... 2017 1 0858336

(51) Int. Cl.
*H01L 27/12* (2006.01)
*H01L 29/66* (2006.01)
(Continued)

(52) U.S. Cl.
CPC ...... *H01L 27/1218* (2013.01); *H01L 27/1262* (2013.01); *H01L 27/3258* (2013.01);
(Continued)

(58) Field of Classification Search
CPC ............. H01L 27/1218; H01L 27/1262; H01L 27/3258; H01L 27/3272; H01L 29/66742; H01L 29/7869
See application file for complete search history.

(56) References Cited

U.S. PATENT DOCUMENTS

2011/0031491 A1* 2/2011 Yamazaki ......... G02F 1/136227
257/43
2014/0034944 A1* 2/2014 Zan ..................... H01L 29/7869
257/43
(Continued)

FOREIGN PATENT DOCUMENTS

CN      103855225 A      6/2014
CN      104977764 A      10/2015

*Primary Examiner* — Allan R Wilson
(74) *Attorney, Agent, or Firm* — Mark M. Friedman

(57) ABSTRACT

A thin film transistor structure is provided with a glass substrate, a buffer layer, a metal oxide semiconductor layer, a gate insulating layer, a gate metal layer, an interlayer insulating layer, a source metal layer, a drain metal layer, and a protective layer. A shielding metal layer is disposed between the glass substrate and the buffer layer, the gate insulating layer has a shielding metal layer contact hole passing through the gate insulating layer and the buffer layer, and the gate metal layer connects with the shielding metal layer through the shielding metal layer contact hole.

11 Claims, 2 Drawing Sheets

(51) Int. Cl.
*H01L 27/32* (2006.01)
*H01L 29/786* (2006.01)
(52) U.S. Cl.
CPC .... *H01L 27/3272* (2013.01); *H01L 29/66742* (2013.01); *H01L 29/7869* (2013.01)

(56) References Cited

U.S. PATENT DOCUMENTS

| | | | |
|---|---|---|---|
| 2014/0138677 A1* | 5/2014 | Chen | H01L 29/66969 257/43 |
| 2014/0151708 A1 | 6/2014 | Jeon et al. | |
| 2015/0294993 A1* | 10/2015 | Kim | H01L 29/66969 257/43 |
| 2016/0370621 A1* | 12/2016 | Huang | G02F 1/1368 |
| 2018/0122882 A1* | 5/2018 | Lee | H01L 27/1248 |
| 2018/0350994 A1* | 12/2018 | Hosaka | H01L 21/28 |

* cited by examiner

THIN FILM TRANSISTOR STRUCTURE AND METHOD FOR MANUFACTURING SAME

FIELD OF INVENTION

The present invention relates to a display technology, and more particularly to a thin film transistor structure and a method for manufacturing the thin film transistor structure.

BACKGROUND OF INVENTION

With development of science and technology, active-matrix organic light emitting diode (AMOLED) display devices are more and more popular. Current AMOLED display devices generally use a 3T1C AMOLED driving circuit, which is constituted by three thin film transistors and one capacitor.

Impact of the emitting light and external light will drive a thin film transistor in the AMOLED driving circuit to become unstable, such that it affects display quality of the AMOLED display devices.

It is therefore necessary to provide a thin film transistor structure and a method for manufacturing the thin film transistor structure, in order to solve problems existing in conventional technology as described above.

SUMMARY OF INVENTION

An object of the present invention is to provide a thin film transistor structure and a method for manufacturing the thin film transistor structure for promoting a working stability of a thin film transistor to improve a display quality of an active-matrix organic light emitting diode (AMOLED) display device, in order to solve a problem of a poor working stability of a conventional thin film transistor structure.

The present invention provides a thin film transistor structure, comprising:

a glass substrate, a buffer layer disposed on the glass substrate;

a metal oxide semiconductor layer disposed on the buffer layer, and configured to define a position of an active drive area of the thin film transistor structure through the metal oxide semiconductor layer, wherein the metal oxide semiconductor layer comprises a source electrode area, a drain electrode area, and a channel area;

a gate insulating layer disposed on the metal oxide semiconductor layer to separate the metal oxide semiconductor layer from a gate metal layer;

wherein the gate metal layer is disposed on the gate insulating layer;

an interlayer insulating layer disposed on the gate metal layer for performing a planarization treatment on the glass substrate having the gate metal layer, wherein the interlayer insulating layer has a source contact hole and a drain contact hole therein;

a source metal layer disposed on the interlayer insulating layer, and configured to connect with the source electrode area of the metal oxide semiconductor layer through the source contact hole;

a drain metal layer disposed on the interlayer insulating layer, and configured to connect with the drain electrode area of the metal oxide semiconductor layer through the drain contact hole; and a protective layer disposed on the interlayer insulating layer having the source metal layer and the drain metal layer;

wherein a shielding metal layer is disposed between the glass substrate and the buffer layer, the gate insulating layer has a shielding metal layer contact hole passing through the gate insulating layer and the buffer layer, and the gate metal layer connects with the shielding metal layer through the shielding metal layer contact hole;

a projection area of the shielding metal layer on a plane of the glass substrate covers a projection area of the metal oxide semiconductor layer on the plane of the glass substrate;

the projection area of the shielding metal layer on the plane of the glass substrate covers an entire area of the thin film transistor structure corresponding to the plane of the glass substrate;

the shielding metal layer has a thickness ranging from 500 Å to 2000 Å;

the buffer layer has a thickness ranging from 1000 Å to 5000 Å;

the metal oxide semiconductor layer has a thickness ranging from 100 Å to 1000 Å;

the gate insulating layer has a thickness ranging from 1000 Å to 3000 Å;

the interlayer insulating layer has a thickness ranging from 2000 Å to 10000 Å;

the source metal layer has a thickness ranging from 2000 Å to 8000 Å;

the drain metal layer has a thickness ranging from 2000 Å to 8000 Å;

the protective layer has a thickness from 1000 Å to 5000 Å;

a material of the shielding metal layer is at least one of a molybdenum metal, an aluminum metal, a copper metal, and a titanium metal;

a material of the buffer layer is at least one of silica and silicon nitride;

a material of the metal oxide semiconductor layer is at least one of indium gallium zinc oxide, indium tin zinc oxide, and indium gallium zinc tin oxide;

a material of the gate insulating layer is at least one of silica and silicon nitride;

a material of the gate metal layer is at least one of a molybdenum metal, an aluminum metal, a copper metal, and a titanium metal;

a material of the source metal layer is at least one of a molybdenum metal, an aluminum metal, a copper metal, and a titanium metal;

a material of the drain metal layer is at least one of a molybdenum metal, an aluminum metal, a copper metal, and a titanium metal;

a material of the interlayer insulating layer is at least one of silica and silicon nitride; and;

a material of the protective layer is at least one of silica and silicon nitride.

A further embodiment of the present invention provides a thin film transistor structure, comprising:

a glass substrate;

a buffer layer disposed on the glass substrate;

a metal oxide semiconductor layer disposed on the buffer layer, and configured to define a position of an active drive area of the thin film transistor structure through the metal oxide semiconductor layer, wherein the metal oxide semiconductor layer comprises a source electrode area, a drain electrode area, and a channel area;

a gate insulating layer disposed on the metal oxide semiconductor layer to separate the metal oxide semiconductor layer from a gate metal layer;

wherein the gate metal layer is disposed on the gate insulating layer;

an interlayer insulating layer disposed on the gate metal layer for performing a planarization treatment on the glass substrate having the gate metal layer, wherein the interlayer insulating layer has a source contact hole and a drain contact hole therein;

a source metal layer disposed on the interlayer insulating layer, and configured to connect with the source electrode area of the metal oxide semiconductor layer through the source contact hole;

a drain metal layer disposed on the interlayer insulating layer, and configured to connect with the drain electrode area of the metal oxide semiconductor layer through the drain contact hole; and a protective layer disposed on the interlayer insulating layer having the source metal layer and the drain metal layer;

wherein a shielding metal layer is disposed between the glass substrate and the buffer layer;

the gate insulating layer has a shielding metal layer contact hole passing through the gate insulating layer and the buffer layer, and the gate metal layer connects with the shielding metal layer through the shielding metal layer contact hole.

In the thin film transistor structure of the present invention, a projection area of the shielding metal layer on a plane of the glass substrate covers a projection area of the metal oxide semiconductor layer on the plane of the glass substrate.

In the thin film transistor structure of the present invention, the projection area of the shielding metal layer on the plane of the glass substrate covers an entire area of the thin film transistor structure corresponding to the plane of the glass substrate.

In the thin film transistor structure of the present invention, the shielding metal layer has a thickness ranging from 500 Å to 2000 Å;

the buffer layer has a thickness ranging from 1000 Å to 5000 Å;

the metal oxide semiconductor layer has a thickness ranging from 100 Å to 1000 Å;

the gate insulating layer has a thickness ranging from 1000 Å to 3000 Å;

the interlayer insulating layer has a thickness ranging from 2000 A to 10000 Å;

the source metal layer has a thickness ranging from 2000 Å to 8000 Å;

the drain metal layer has a thickness ranging from 2000 Å to 8000 Å; and the protective layer has a thickness ranging from 1000 Å to 5000 Å.

In the thin film transistor structure of the present invention, a material of the shielding metal layer is at least one of a molybdenum metal, an aluminum metal, a copper metal, and a titanium metal;

a material of the gate metal layer is at least one of a molybdenum metal, an aluminum metal, a copper metal, and a titanium metal;

a material of the source metal layer is at least one of a molybdenum metal, an aluminum metal, a copper metal, and a titanium metal; and a material of the drain metal layer is at least one of a molybdenum metal, an aluminum metal, a copper metal, and a titanium metal.

In the thin film transistor structure of the present invention, a material of the buffer layer is at least one of silica and silicon nitride;

a material of the gate insulating layer is at least one of silica and silicon nitride;

a material of the interlayer insulating layer is at least one of silica and silicon nitride; and a material of the protective layer is at least one of silica and silicon nitride.

In the thin film transistor structure of the present invention, a material of the metal oxide semiconductor layer is at least one of indium gallium zinc oxide, indium tin zinc oxide, and indium gallium zinc tin oxide.

The present invention further provides a method for manufacturing a thin film transistor structure, comprising steps of:

providing a glass substrate;

depositing a shielding metal layer on the glass substrate, and patterning the shielding metal layer;

depositing a buffer layer on the shielding metal layer;

depositing a metal oxide semiconductor layer on the buffer layer, and patterning the metal oxide semiconductor layer to define a position of an active area of the thin film transistor structure; wherein the metal oxide semiconductor layer comprises a source electrode area, a drain electrode area, and a channel area;

depositing a gate insulating layer on the metal oxide semiconductor layer, and the gate insulating layer is provided with a metal oxide semiconductor layer contact hole passing through the gate insulating layer and the buffer layer;

depositing a gate metal layer on the gate insulating layer, and patterning the gate metal layer; wherein the gate metal layer connects with the shielding metal layer through the shielding metal layer contact hole;

depositing an interlayer insulating layer on the gate metal layer, and the interlayer insulating layer is provided with a source contact hole and a drain contact hole;

applying a source metal layer and a drain metal layer on the interlayer insulating layer, wherein the source metal layer connects with the source electrode area of the metal oxide semiconductor layer through the source contact hole; and the drain metal layer connect with the drain electrode area of the metal oxide semiconductor layer through the drain contact hole; and depositing a protective layer on the source metal layer and the drain metal layer.

In the method for manufacturing the thin film transistor structure, a projection area of the shielding metal layer on a plane of the glass substrate covers a projection area of the metal oxide semiconductor layer on the plane of the glass substrate.

In the method for manufacturing the thin film transistor structure, the projection area of the shielding metal layer on the plane of the glass substrate covers an entire area of the thin film transistor structure corresponding to the plane of the glass substrate.

In the method for manufacturing the thin film transistor structure, the shielding metal layer has a thickness ranging from 500 Å to 2000 Å;

the buffer layer has a thickness ranging from 1000 Å to 5000 Å;

the metal oxide semiconductor layer has a thickness ranging from 100 Å to 1000 Å;

the gate insulating layer has a thickness ranging from 1000 Å to 3000 Å;

the interlayer insulating layer has a thickness ranging from 2000 Å to 10000 Å;

the source metal layer has a thickness ranging from 2000 Å to 8000 Å;

the drain metal layer has a thickness ranging from 2000 Å to 8000 Å; and the protective layer has a thickness ranging from 1000 Å to 5000 Å.

In the method for manufacturing the thin film transistor structure, a material of the shielding metal layer is at least one of a molybdenum metal, an aluminum metal, a copper metal, and a titanium metal;

a material of the gate metal layer is at least one of a molybdenum metal, an aluminum metal, a copper metal, and a titanium metal;

a material of the source metal layer is at least one of a molybdenum metal, an aluminum metal, a copper metal, and a titanium metal; and a material of the drain metal layer is at least one of a molybdenum metal, an aluminum metal, a copper metal, and a titanium metal.

In the method for manufacturing the thin film transistor structure, a material of the buffer layer is at least one of silica and silicon nitride;

a material of the gate insulating layer is at least one of silica and silicon nitride;

a material of the interlayer insulating layer is at least one of silica and silicon nitride; and a material of the protective layer is at least one of silica and silicon nitride.

In the method for manufacturing the thin film transistor structure, a material of the metal oxide semiconductor layer is at least one of indium gallium zinc oxide, indium tin zinc oxide, and indium gallium tin oxide.

In the thin film transistor structure and the method for manufacturing the same of the present invention, the shielding metal layer is configured to promote the working stability of the thin film transistor in the AMOLED driving circuit, and thus the display quality of an AMOLED display device is improved. The technical problem of the poor working stability occurs in a conventional thin film transistor structure is solved.

BRIEF DESCRIPTION OF DRAWINGS

In order to more clearly illustrate the technical solutions in the embodiment or in the present invention, the following drawings, which are intended to be used in the description of the embodiment or of the present invention, will be briefly described. It is understood that the drawings described below are merely some embodiments of the present invention, and it will be possible to those skilled in the art to obtain other drawings according to these drawings without creative efforts.

DETAILED DESCRIPTION OF PREFERRED EMBODIMENTS

The technical solutions in the embodiment of the present invention are clearly and completely described below by referring to the accompany drawings in the embodiment of the present invention. Apparently, the described embodiments are merely a part of embodiment of the present invention rather than total embodiment. According to the embodiment of the present invention, other embodiments obtained by those of ordinary skill in the art without making creative efforts shall fall within the protection scope of the present invention.

Figure 1A:
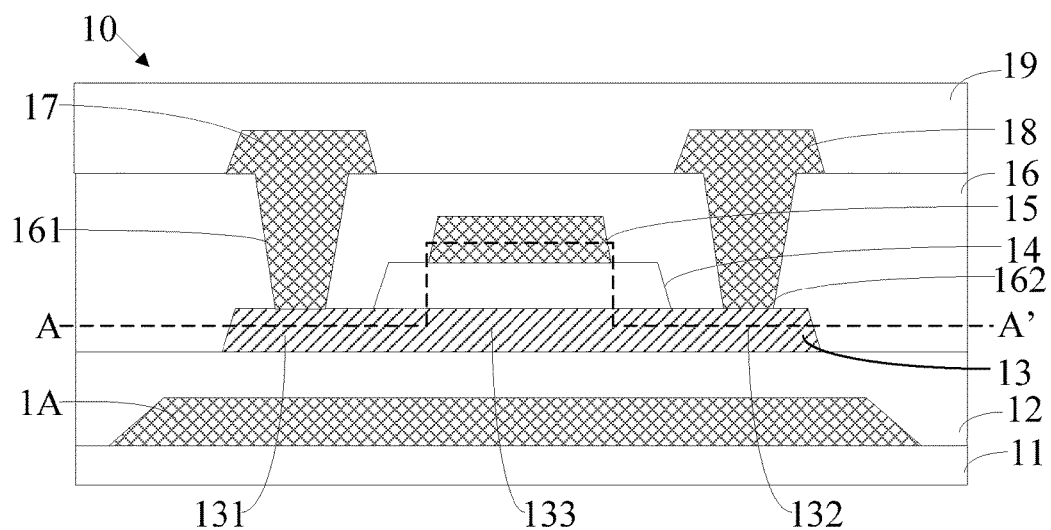
FIG. 1a is a schematic structure of a thin film transistor structure according to one embodiment of the present invention.
Figure 1B:
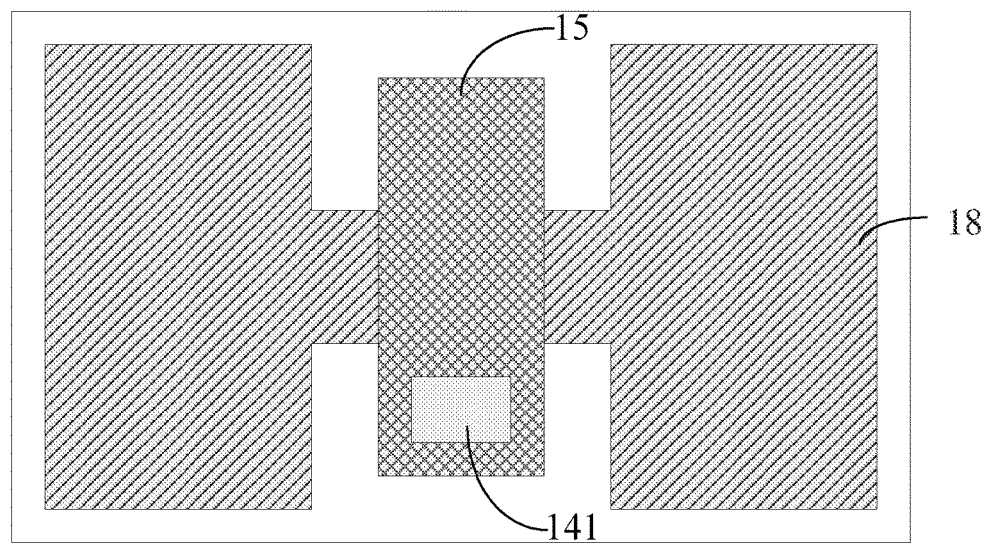
FIG. 1b is a top view of the thin film transistor structure in FIG. 1a taken along A-A'.

Refer to FIG. 1a, FIG. 1a is a schematic structure of a thin film transistor structure according to one embodiment of the present invention. FIG. 1b is a top view of the thin film transistor structure in FIG. 1a taken along A-A'. A thin film transistor structure 10 of this embodiment comprises a glass substrate 11, a buffer layer 12, a metal oxide semiconductor layer 13, a gate insulating layer 14, a gate metal layer 15, an interlayer insulating layer 16, a source metal layer 17, a drain metal layer 18, and a protective layer 19.

The buffer layer 12 is disposed on the glass substrate 11. The metal oxide semiconductor layer 13 is disposed on the buffer layer 12, and configured to define a position of an active drive area of the thin film transistor structure through the metal oxide semiconductor layer 13. The metal oxide semiconductor layer 13 comprises a source electrode area 131, a drain electrode area 132, and a channel area 133. The gate insulating layer 14 is disposed on the metal oxide semiconductor layer 13 to separate the metal oxide semiconductor layer 13 from the gate metal layer 15. The gate metal layer 15 is disposed on the gate insulating layer 14. The interlayer insulating layer 16 is disposed on the gate metal layer 15 for performing a planarization treatment on the glass substrate 11 having the gate metal layer 15. The interlayer insulating layer 16 has a source contact hole 161 and a drain contact hole 162 therein. The source metal layer 17 is disposed on the interlayer insulating layer 16, and configured to connect with the source electrode area 131 of the metal oxide semiconductor layer 13 through the source contact hole 161. The drain metal layer 18 is disposed on the interlayer insulating layer 16, and configured to connect with the drain electrode area 132 of the metal oxide semiconductor layer 13 through the drain contact hole 162. A protective layer 19 is disposed on the interlayer insulating layer 16 having the source metal layer 17 and the drain metal layer 18. A shielding metal layer 1A is disposed between the glass substrate 11 and the buffer layer 12. The gate insulating layer 14 has a shielding metal layer contact hole 141 passing through the gate insulating layer 14 and the buffer layer 12, and the gate metal layer 15 connects with the shielding metal layer 1A through the shielding metal layer contact hole 141.

A projection area of the shielding metal layer 1A on a plane of the glass substrate 11 covers a projection area of the metal oxide semiconductor layer 13 on the plane of the glass substrate 11. Specifically, the projection area of the shielding metal layer 1A on the plane of the glass substrate 11 covers an entire area of the thin film transistor structure 10 corresponding to the plane of the glass substrate 11.

Figure 2:
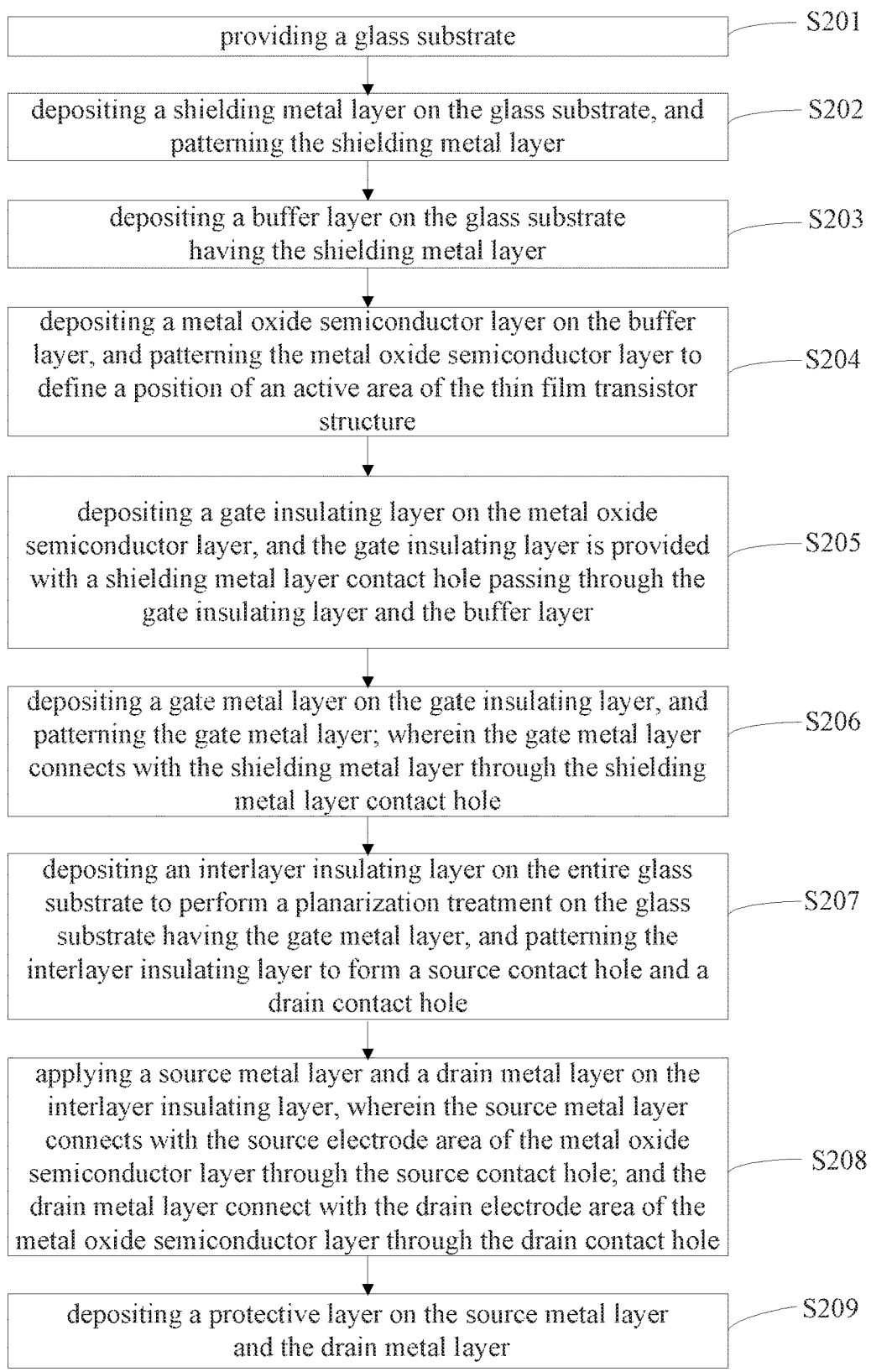
FIG. 2 is a flow chart of a method for manufacturing a thin film transistor structure according to one embodiment of the present invention.

Refer to FIG. 2, FIG. is a flow chart of a method for manufacturing a thin film transistor structure according to one embodiment of the present invention. The method for manufacturing the thin film transistor structure of this embodiment comprises:

Step S201: providing a glass substrate, and cleaning and baking the glass substrate;

Step S202: depositing a shielding metal layer on the glass substrate, and patterning the shielding metal layer. The shielding metal layer has a thickness ranging from 500 Å to 2000 Å, and a material of the shielding metal layer can be at least one of a molybdenum metal (Mo), an aluminum metal (Al), a copper metal (Cu), and a titanium metal (Ti).

A projection area of the shielding metal layer on a plane of the glass substrate covers a projection area of the metal oxide semiconductor layer on the plane of the glass substrate. Preferably, the projection area of the shielding metal layer on the plane of the glass substrate covers an entire area of the thin film transistor structure corresponding to the plane of the glass substrate.

Step S203: depositing a buffer layer on the shielding metal layer. A material of the buffer layer is at least one of silica (Sic) and silicon nitride (SiN). The buffer layer has a thickness ranging from 1000 Å to 5000 Å.

Step S204: depositing a metal oxide semiconductor layer on the buffer layer, and patterning the metal oxide semiconductor layer to define a position of an active area of the thin film transistor structure. The metal oxide semiconductor layer comprises a source electrode area, a drain electrode area, and a channel area. A material of the metal oxide semiconductor layer is at least one of indium gallium zinc oxide (IGZO), indium tin zinc oxide (IZTO), and indium gallium zinc tin oxide (IGZTO). The metal oxide semiconductor layer has a thickness ranging from 100 Å to 1000 Å.

Step S205: depositing a gate insulating layer on the metal oxide semiconductor layer to separate the metal oxide semiconductor layer from a gate metal layer, and the gate insulating layer is provided with a shielding metal layer contact hole passing through the gate insulating layer and the buffer layer. A material of the gate insulating layer is at least one of silica and silicon nitride. The gate insulating layer has a thickness ranging from 1000 Å to 3000 Å.

Step S206: depositing a gate metal layer on the gate insulating layer, and patterning the gate metal layer to connect the gate metal layer with the shielding metal layer through the shielding metal layer contact hole. A material of the gate metal layer is at least one of a molybdenum metal, an aluminum metal, a copper metal, and a titanium metal.

Step S207: depositing an interlayer insulating layer on the entire glass substrate to perform a planarization treatment on the glass substrate having the gate metal layer, and patterning the interlayer insulating layer to form a source contact hole and a drain contact hole. A material of the interlayer insulating layer is at least one of silica and silicon nitride. The interlayer insulating layer has a thickness ranging from 2000 Å to 10000 Å.

Step S208: depositing a source metal layer and a drain metal layer on the interlayer insulating layer, wherein the source metal layer connects with the source electrode area of the metal oxide semiconductor layer through the source contact hole. A material of the source metal layer is at least one of a molybdenum metal, an aluminum metal, a copper metal, and a titanium metal. A material of the drain metal layer is at least one of a molybdenum metal, an aluminum metal, a copper metal, and a titanium metal. The source metal layer has a thickness ranging from 2000 Å to 8000 Å, The drain metal layer has a thickness ranging from 2000 Å to 8000 Å.

Step 3209: depositing a protective layer on the entire glass substrate. A material of the protective layer is at least one of silica and silicon nitride. The protective layer has a thickness from 1000 Å to 5000 Å.

In this way, the producing process of the thin film transistor structure of this embodiment is completed.

When the thin film transistor structure 10 of this embodiment is used, the shielding metal layer 1A can block all of the light which emits to the metal oxide semiconductor layer 13, thereby the working stability of the thin film transistor can be improved.

Because the area of the shielding metal layer 1A in the thin film transistor structure 10 of this embodiment is larger, it is possible to generate a greater parasitic capacitance. Thus, the shielding metal layer contact hole 141 is configured to connect the gate metal layer 15 with the shielding metal layer 1A to reduce the parasitic capacitance generated by the thin film transistor structure 10. In this way, when the thin filth transistor structure 10 works, it has a dual channel effect to help improve the performance of the thin film transistor device.

In the thin film transistor structure and the method for manufacturing the same of the present invention, the shielding metal layer is configured to promote the working stability of the thin film transistor in the AMOLED driving circuit, and thus the display quality of an AMOLED display device is improved. The technical problem of the poor working stability occurs in a conventional thin film transistor structure is solved.

The present invention has been described with preferred embodiments thereof and it is understood that many changes and modifications to the described embodiments can be carried out by the skilled person in the art without departing from the scope and the spirit of the invention that is intended to be limited only by the appended claims.

What is claimed is:

1. A thin film transistor structure, comprising:
a glass substrate,
a buffer layer disposed on the glass substrate;
a metal oxide semiconductor layer disposed on the buffer layer, and configured to define a position of an active drive area of the thin film transistor structure through the metal oxide semiconductor layer, wherein the metal oxide semiconductor layer comprises a source electrode area, a drain electrode area, and a channel area;
a gate insulating layer disposed on the metal oxide semiconductor layer to separate the metal oxide semiconductor layer from a gate metal layer;
wherein the gate metal layer is disposed on the gate insulating layer;
an interlayer insulating layer disposed on the gate metal layer for performing a planarization treatment on the glass substrate having the gate metal layer, wherein the interlayer insulating layer has a source contact hole and a drain contact hole therein;
a source metal layer disposed on the interlayer insulating layer, and configured to connect with the source electrode area of the metal oxide semiconductor layer through the source contact hole;
a drain metal layer disposed on the interlayer insulating layer, and configured to connect with the drain electrode area of the metal oxide semiconductor layer through the drain contact hole; and
a protective layer disposed on the interlayer insulating layer having the source metal layer and the drain metal layer;
wherein a shielding metal layer is disposed between the glass substrate and the buffer layer,
the gate insulating layer has a shielding metal layer contact hole passing through the gate insulating layer and the buffer layer, and the gate metal layer connects with the shielding metal layer through the shielding metal layer contact hole;
a projection area of the shielding metal layer on a plane of the glass substrate covers a projection area of the metal oxide semiconductor layer on the plane of the glass substrate;
the projection area of the shielding metal layer on the plane of the glass substrate covers an entire area of the thin film transistor structure corresponding to the plane of the glass substrate;
the shielding metal layer has a thickness ranging from 500 Å to 2000 Å;

the buffer layer has a thickness ranging from 1000 Å to 5000 Å;
the metal oxide semiconductor layer has a thickness ranging from 100 Å to 1000 Å;
the gate insulating layer has a thickness ranging from 1000 Å to 3000 Å;
the interlayer insulating layer has a thickness ranging from 2000 Å to 10000 Å;
the source metal layer has a thickness ranging from 2000 Å to 8000 Å;
the drain metal layer has a thickness ranging from 2000 Å to 8000 Å;
the protective layer has a thickness from 1000 Å to 5000 Å;
a material of the shielding metal layer is at least one of a molybdenum metal, an aluminum metal, a copper metal, and a titanium metal;
a material of the buffer layer is at least one of silica and silicon nitride;
a material of the metal oxide semiconductor layer is at least one of indium gallium zinc oxide, indium tin zinc oxide, and indium gallium zinc tin oxide;
a material of the gate insulating layer is at least one of silica and silicon nitride;
a material of the gate metal layer is at least one of a molybdenum metal, an aluminum metal, a copper metal, and a titanium metal;
a material of the source metal layer is at least one of a molybdenum metal, an aluminum metal, a copper metal, and a titanium metal;
a material of the drain metal layer is at least one of a molybdenum metal, an aluminum metal, a copper metal, and a titanium metal;
a material of the interlayer insulating layer is at least one of silica and silicon nitride; and
a material of the protective layer is at least one of silica and silicon nitride.

2. A thin film transistor structure, comprising:
a glass substrate;
a buffer layer disposed on the glass substrate;
a metal oxide semiconductor layer disposed on the buffer layer, and configured to define a position of an active drive area of the thin film transistor structure through the metal oxide semiconductor layer, wherein the metal oxide semiconductor layer comprises a source electrode area, a drain electrode area, and a channel area;
a gate insulating layer disposed on the metal oxide semiconductor layer to separate the metal oxide semiconductor layer from a gate metal layer;
wherein the gate metal layer is disposed on the gate insulating layer;
an interlayer insulating layer disposed on the glass substrate having the gate metal layer for performing a planarization treatment on the glass substrate having the gate metal layer, wherein the interlayer insulating layer has a source contact hole and a drain contact hole therein;
a source metal layer disposed on the interlayer insulating layer, and configured to connect with the source electrode area of the metal oxide semiconductor layer through the source contact hole;
a drain metal layer disposed on the interlayer insulating layer, and configured to connect with the drain electrode area of the metal oxide semiconductor layer through the drain contact hole; and
a protective layer disposed on the interlayer insulating layer having the source metal layer and the drain metal layer;
wherein a shielding metal layer is disposed between the glass substrate and the buffer layer,
the gate insulating layer has a shielding metal layer contact hole passing through the gate insulating layer and the buffer layer, and the gate metal layer connects with the shielding metal layer through the shielding metal layer contact hole,
wherein a projection area of the shielding metal layer on a plane of the glass substrate covers a projection area of the metal oxide semiconductor layer on the plane of the glass substrate, and the projection area of the shielding metal layer on the plane of the glass substrate covers an entire area of the thin film transistor structure corresponding to the plane of the glass substrate.

3. The thin film transistor structure according to claim 2, wherein the shielding metal layer has a thickness ranging from 500 Å to 2000 Å;
the buffer layer has a thickness ranging from 1000 Å to 5000 Å;
the metal oxide semiconductor layer has a thickness ranging from 100 Å to 1000 Å;
the gate insulating layer has a thickness ranging from 1000 Å to 3000 Å;
the interlayer insulating layer has a thickness ranging from 2000 Å to 10000 Å;
the source metal layer has a thickness ranging from 2000 Å to 8000 Å;
the drain metal layer has a thickness ranging from 2000 Å to 8000 Å; and
the protective layer has a thickness ranging from 1000 Å to 5000 Å.

4. The thin film transistor structure according to claim 2, wherein
a material of the shielding metal layer is at least one of a molybdenum metal, an aluminum metal, a copper metal, and a titanium metal;
a material of the gate metal layer is at least one of a molybdenum metal, an aluminum metal, a copper metal, and a titanium metal;
a material of the source metal layer is at least one of a molybdenum metal, an aluminum metal, a copper metal, and a titanium metal; and
a material of the drain metal layer is at least one of a molybdenum metal, an aluminum metal, a copper metal, and a titanium metal.

5. The thin film transistor structure according to claim 2, wherein a material of the buffer layer is at least one of silica and silicon nitride;
a material of the gate insulating layer is at least one of silica and silicon nitride;
a material of the interlayer insulating layer is at least one of silica and silicon nitride; and
a material of the protective layer is at least one of silica and silicon nitride.

6. The thin film transistor structure according to claim 2, wherein a material of the metal oxide semiconductor layer is at least one of indium gallium zinc oxide, indium tin zinc oxide, and indium gallium zinc tin oxide.

7. A method for manufacturing a thin film transistor structure, comprising steps of:
providing a glass substrate;
depositing a shielding metal layer on the glass substrate, and patterning the shielding metal layer;
depositing a buffer layer on the shielding metal layer;

depositing a metal oxide semiconductor layer on the buffer layer, and patterning the metal oxide semiconductor layer to define a position of an active area of the thin film transistor structure; wherein the metal oxide semiconductor layer comprises a source electrode area, a drain electrode area, and a channel area;

depositing a gate insulating layer on the metal oxide semiconductor layer, and the gate insulating layer is provided with a shielding metal layer contact hole passing through the gate insulating layer and the buffer layer;

depositing a gate metal layer on the gate insulating layer, and patterning the gate metal layer; wherein the gate metal layer connects with the shielding metal layer through the shielding metal layer contact hole;

depositing an interlayer insulating layer on the gate metal layer, and the interlayer insulating layer is provided with a source contact hole and a drain contact hole;

applying a source metal layer and a drain metal layer on the interlayer insulating layer, wherein the source metal layer connects with the source electrode area of the metal oxide semiconductor layer through the source contact hole; and the drain metal layer connect with the drain electrode area of the metal oxide semiconductor layer through the drain contact hole; and depositing a protective layer on the source metal layer and the drain metal layer, wherein a projection area of the shielding metal layer on a plane of the glass substrate covers a projection area of the metal oxide semiconductor layer on the plane of the glass substrate, and the projection area of the shielding metal layer on the plane of the glass substrate covers an entire area of the thin film transistor structure corresponding to the plane of the glass substrate.

8. The method for manufacturing a thin film transistor structure according to claim 7, wherein the shielding metal layer has a thickness ranging from 500 Å to 2000 Å;

the buffer layer has a thickness ranging from 1000 Å to 5000 Å;

the metal oxide semiconductor layer has a thickness ranging from 100 Å to 1000 Å;

the gate insulating layer has a thickness ranging from 1000 Å to 3000 Å;

the interlayer insulating layer has a thickness ranging from 2000 Å to 10000 Å;

the source metal layer has a thickness ranging from 2000 Å to 8000 Å;

the drain metal layer has a thickness ranging from 2000 Å to 8000 Å; and the protective layer has a thickness ranging from 1000 Å to 5000 Å.

9. The method for manufacturing a thin film transistor structure according to claim 7, wherein a material of the shielding metal layer is at least one of a molybdenum metal, an aluminum metal, a copper metal, and a titanium metal;

a material of the gate metal layer is at least one of a molybdenum metal, an aluminum metal, a copper metal, and a titanium metal;

a material of the source metal layer is at least one of a molybdenum metal, an aluminum metal, a copper metal, and a titanium metal; and a material of the drain metal layer is at least one of a molybdenum metal, an aluminum metal, a copper metal, and a titanium metal.

10. The method for manufacturing a thin film transistor structure according to claim 7, wherein a material of the buffer layer is at least one of silica and silicon nitride;

a material of the gate insulating layer is at least one of silica and silicon nitride;

a material of the interlayer insulating layer is at least one of silica and silicon nitride; and a material of the protective layer is at least one of silica and silicon nitride.

11. The method for manufacturing a thin film transistor structure according to claim 7, wherein a material of the metal oxide semiconductor layer is at least one of indium gallium zinc oxide, indium tin zinc oxide, and indium gallium tin oxide.

* * * * *